(12) United States Patent
Thomann et al.

(10) Patent No.: US 6,694,416 B1
(45) Date of Patent: Feb. 17, 2004

(54) DOUBLE DATA RATE SCHEME FOR DATA OUTPUT

(75) Inventors: Mark R. Thomann, Boise, ID (US); Wen Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/388,686

(22) Filed: Sep. 2, 1999

(51) Int. Cl.7 .............................................. G06F 12/00
(52) U.S. Cl. ........................ 711/169; 711/104; 711/105; 711/167; 711/157; 710/7; 710/20; 710/21; 710/60
(58) Field of Search ................................ 711/104, 105, 711/169, 157, 167, 20, 21, 60; 710/7, 20, 21, 60; 365/189.02, 189.05, 233

(56) References Cited

U.S. PATENT DOCUMENTS

| | | | |
|---|---|---|---|
| 4,463,443 A | 7/1984 | Frankel et al. ................. 710/60 |
| 5,007,012 A | 4/1991 | Dujari .......................... 710/22 |
| 5,402,389 A | 3/1995 | Flannagan et al. ........... 365/233 |
| 5,506,814 A | 4/1996 | Hush et al. ............. 365/230.03 |
| 5,592,488 A | 1/1997 | Thomann et al. ............ 370/465 |
| 5,657,289 A | 8/1997 | Hush et al. ............. 365/230.05 |
| 5,699,314 A | 12/1997 | Hush et al. ............. 365/230.03 |
| 5,703,826 A | 12/1997 | Hush et al. ............. 365/230.05 |
| 5,717,647 A | 2/1998 | Hush et al. ............. 365/230.05 |
| 5,778,007 A | 7/1998 | Thomann et al. ............ 714/763 |
| 5,815,447 A | 9/1998 | Thomann ................... 365/47.53 |
| 5,822,266 A | 10/1998 | Kikinis ........................ 365/222 |
| 5,834,813 A | 11/1998 | Ma et al. ..................... 257/368 |
| 5,854,800 A | 12/1998 | Thomann et al. ............ 714/758 |
| 5,875,134 A | 2/1999 | Cloud .......................... 365/193 |
| 5,915,128 A | 6/1999 | Bauman et al. ............... 710/60 |
| 5,920,511 A | 7/1999 | Lee et al. ............... 365/189.05 |
| 5,923,901 A | 7/1999 | Kawaura ...................... 710/53 |
| 5,953,258 A | 9/1999 | Thomann ............... 365/189.01 |
| 5,963,469 A | 10/1999 | Forbes ......................... 365/149 |
| 5,986,948 A | 11/1999 | Cloud .......................... 365/193 |
| 6,060,916 A | 5/2000 | Park ............................. 327/99 |
| 6,067,585 A | 5/2000 | Hoang .......................... 710/11 |
| 6,078,546 A * | 6/2000 | Lee ............................. 365/233 |
| 6,112,267 A | 8/2000 | McCormack et al. ......... 710/52 |
| 6,151,271 A | 11/2000 | Lee ............................. 365/233 |
| 6,314,042 B1 | 11/2001 | Tomishima et al. ..... 365/230.03 |
| 6,446,180 B2 * | 9/2002 | Li et al. ...................... 711/167 |
| 6,477,107 B1 | 11/2002 | Lee ............................. 365/233 |
| 6,477,592 B1 | 11/2002 | Chen et al. ................... 710/52 |
| 6,516,363 B1 * | 2/2003 | Porter et al. ................. 710/60 |
| 6,522,599 B2 | 2/2003 | Ooishi et al. ................ 365/233 |

FOREIGN PATENT DOCUMENTS

| | | | |
|---|---|---|---|
| DE | 19821641 | 7/1999 | ........... G06F/12/00 |
| EP | 0778575 | 6/1997 | ............ G11C/7/00 |
| WO | 99/50862 | 10/1999 | ............ G11C/7/00 |

OTHER PUBLICATIONS

"Increasing Data Read Rate from Memories", *IBM Technical Disclosure Bulletin*, 30, 339–341, (May, 1988).

* cited by examiner

*Primary Examiner*—Mano Padmanabhan
*Assistant Examiner*—Mehdi Namazi
(74) *Attorney, Agent, or Firm*—Schwegman, Lundberg, Woessner & Kluth, P.A.

(57) ABSTRACT

Systems, devices, and methods. A double data rate memory device includes a storage element, a first pipeline, and a second pipeline. The pipelines are connected to the storage unit to pass or output data on rising and falling edges of an external clock signal. The device permits data transferring at dual data rates. Another memory device includes a storage element and a plurality of pipelines for transferring data. The plurality of pipelines each pass data on different events.

36 Claims, 10 Drawing Sheets

DOUBLE DATA RATE SCHEME FOR DATA OUTPUT

FIELD OF THE INVENTION

This invention relates generally to memory devices, and more particularly to dynamic memory.

BACKGROUND OF THE INVENTION

Memory circuits are vital components in computer and electronic systems which require permanent or temporary data storage. The memory circuits, such as dynamic random access memory (DRAM), are used in computer systems such as a processor system.

In processor based systems and electronic systems, the system operates at a certain frequency. Ideally, memory devices would operate at the same frequency as the system. However, memory devices do not generally operate at the same speed as the system. This is due to the high cost involved in manufacturing and operating memory devices that can operate at very high frequencies. Memory devices generally operate at a fraction of the speed of the processor and cause the system to run slower.

Memory devices have been unable to operate at the speed of microprocessors because of how they operate. Memory devices have to be very compact to hold and access the large amounts of data they are required to hold. For these devices to operate faster, a significant cost must be incurred to design and produce these devices. Generally, the cost prohibits the inclusion of faster memory devices in these systems.

In these computer and electronic systems, operational speeds of dynamic random access memories used as main memories have been increased, but are still low compared with operation speeds of microprocessors. This relatively low speed increases a wait time of the microprocessor, and impedes fast processing, as an access time and a cycle time of the DRAM form a bottleneck in a whole system performance.

One way that memory circuits can be made to write and read data faster is to build the memory circuits so they operate at a higher clock frequency. This has been done in microprocessors as can be seen by the increase in operating frequency in microprocessors. For example, a microprocessor running at 200 Mhz is generally much faster than a microprocessor running at 50 Mhz. However, by operating circuits at higher operating frequency, additional problems are encountered. For example, the amount of heat produced and power used by a circuit operating at a higher frequency can be greatly increased. This corresponds to high cost solutions to handle the heat and power problems. Furthermore, the increased use of portable devices, such as laptop computers, requires that power use by circuits be reduced. Also, the higher operating frequency can cause integrated circuit die to be more expensive.

Since memory devices are used in many different systems, increasing the speed of memory devices without significantly increasing the cost of memory devices can allow everything from wordprocessors to automatic teller machines to perform their tasks quicker.

For the reasons stated above, and for other reasons stated below which will become apparent to those skilled in the art upon reading and understanding the present specification, there is a need in the art for double data rate device and methods of reading data at double data rates.

SUMMARY OF THE INVENTION

One embodiment of the present invention is a double data rate memory device. The double data rate memory device includes a storage element, a first pipeline, and a second pipeline. The pipelines are connected to the storage unit to output data from the storage unit on rising and falling edges of an external clock signal. Another embodiment is a memory device. The memory device includes a storage element and a plurality of pipelines. Each of the plurality of pipelines passes data on a plurality of events.

DETAILED DESCRIPTION OF THE INVENTION

Figure 1A:
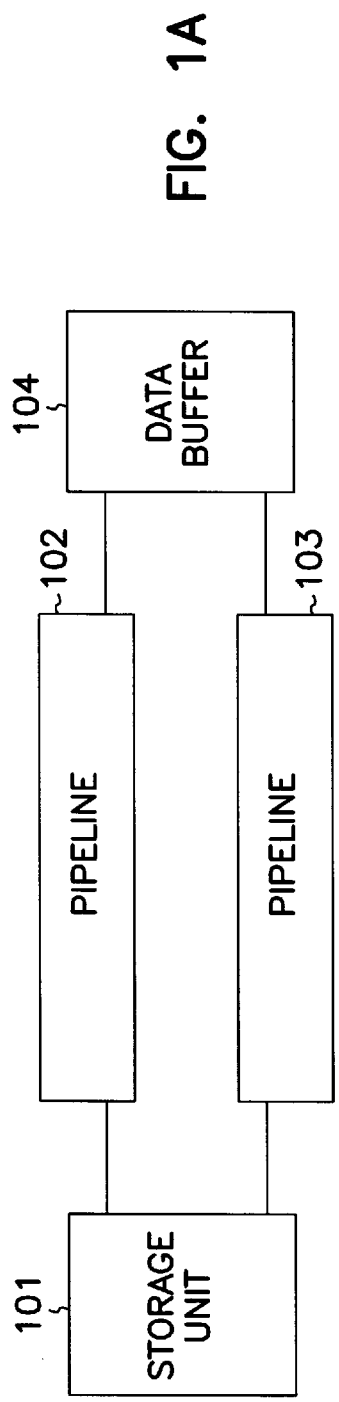
FIGS. 1A and 1B are block diagrams of one embodiment of a double data rate memory device.

In the following detailed description of the preferred embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor, as well as other semiconductor support structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims.

The various embodiments include self-timing, latency programmable pipeline design for the double data rate (DDR) output path. This invention allows a memory device to utilize a single data rate (SDR) dynamic random access memory (DRAM) design. The output data is transformed from an external clock domain to the delay lock loop (DLL) clock domain.

A double data rate device can output data at twice the rate of a single data rate device operating at the same frequency.

For example, a double data rate device may output 20 bits of data in 10 cycles whereas a single data rate device may only output 10 bits of data in 10 cycles. Also, the double data rate device will have similar heat producing characteristics as the single data rate device. A single data rate device would have to operate at twice the speed of a double data rate device to output the same amount of data. By operating at twice the speed, significant heat is produced.

Although the data outputs are on both rising and falling edges, all control signals remain the same frequency as the external clock. Two pipelines, in parallel, can be used to output data on the rising and falling edges of the external clock. By using the propagation time of the pipelines and compensating for it, the data can be output synchronous to the external clock. This approach provides a better design with margins in terms of clock cycle time and process variation.

Using the various embodiments which will be described, a chip can be created that provides data at double data rate and looks to a computer system like a single data rate memory chip.

In another embodiment, a plurality of pipelines are used to output data from a storage unit. The data can be output on events such as different portions of a clock cycle.

FIG. 1A is a memory device according to an embodiment of the invention. The memory device includes a storage unit 101, a first pipeline 102, a second pipeline 103, and a data buffer 104.

The storage unit 101 can be an array of memory cells or an array of memory locations. The storage unit 101 can be a single array or a first and second array. The storage unit 101 can include two or more subarrays located in the same physical array. The storage unit 101 can include two or more subarrays located in two or more physical arrays. Any number of arrays or subarrays may be used. The storage unit 101 stores data which can include first data and second data.

The pipelines, 102 and 103, are connected to the storage unit 101 and the data buffer 104. Data is passed simultaneously from the storage unit 101 to the first pipeline 102 and the second pipeline 103. In one embodiment, the first pipeline 102 is connected to a first array of the storage unit 101 and the second pipeline 103 is connected to a second array of storage unit 101. The first pipeline 102 is used for outputting data or first data on the rising edge of an external clock. The second pipeline 103 is used for outputting data or second data on the falling edge of the external clock. In other embodiments, the first pipeline 102 is used for outputting data on the falling edge of the external clock and the second pipeline 103 is used for outputting data on the rising edge. The pipelines can pass data from the pipelines to a data buffer 104 such that data is received at the data buffer 104 on the rising and falling edges of the external clock. The data buffer 104 can output data to other devices or systems such as a processor or disk drive. In an alternate embodiment, the pipelines pass data directly to other systems or devices, such as processors, memory devices, and hard drives, without passing the data to the data buffer 104. The first pipeline 102 may output data before the second pipeline 103 or the second pipeline 103 may output data before the first pipeline. Generally, this is determined from the latency and address of the data.

Figure 1B:
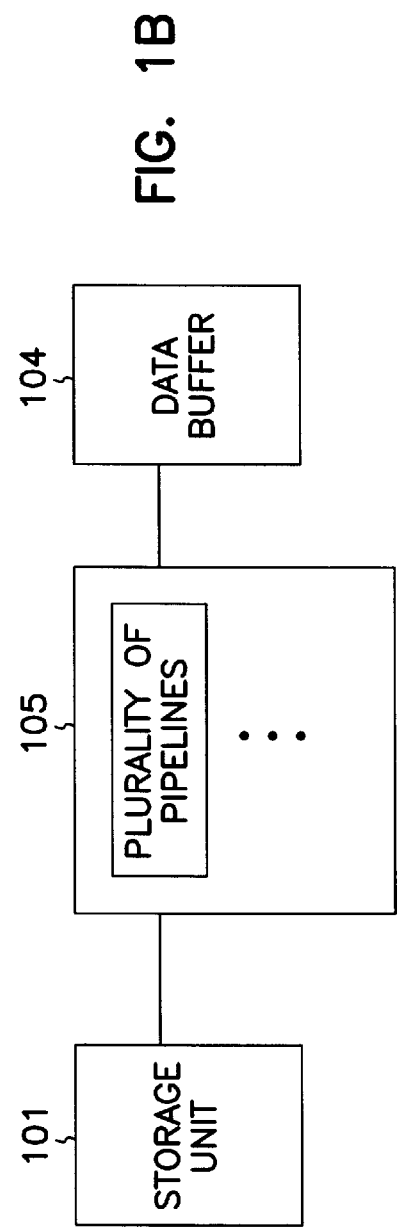

FIG. 1B is a memory device according to one embodiment of the invention. The memory device includes a storage unit 101 and a plurality of pipelines 105. In another embodiment, a plurality of pipelines may be used similar to the first pipeline 102 and second pipeline 103 in FIG. 1A. The plurality of pipelines 105 are connected to the storage unit 101. Data is passed to each of the plurality of pipelines substantially simultaneously from the storage unit 101. The data is then passed from each of the plurality of pipelines to a data buffer 104 on different events or signals such as different clocks, edges of clocks, and phases. For example, in a memory device having four pipelines 105, each pipeline can pass data to data buffer 104 on ninety degree phases of a clock, each pipeline passing data on a separate ninety degree phase.

Figure 2A:
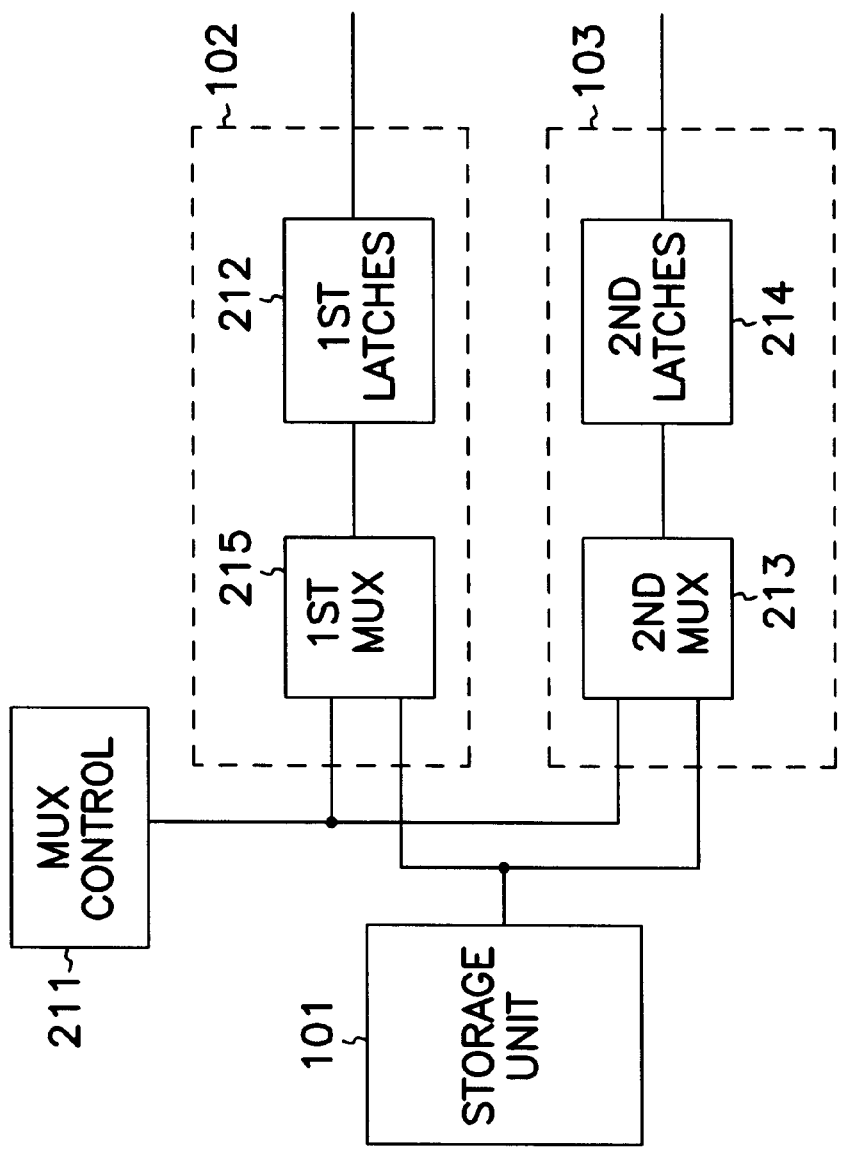
FIGS. 2A and 2B are block diagrams of one embodiment of a double data rate memory device.

FIG. 2A is a memory device according to one embodiment of the invention. The memory device includes a storage unit 101, a first pipeline 102, a second pipeline 103, and a mux control 211. The term "mux" is used to refer to a multiplexor. The first pipeline 102 includes a first mux 215 and at least one first latch 212. The second pipeline 103 includes a second mux 213 and at least one second latch 214.

The storage unit 101 can be an array of memory cells or an array of memory locations. The storage unit 101 can be a single array or a first and second array. The storage unit 101 can include two or more subarrays located in the same physical array. The storage unit 101 can include two or more subarrays located in two or more physical arrays. Any number of arrays or subarrays may be used. Any number of arrays or subarrays may be used.

The first mux 215 is connected to the storage unit 101, mux control 211, and the at least one first latch 212. The first mux 215 directs data to the at least one first latch 212 from the storage unit 101. The at least one first latch 212 passes data on a first event. The first event can be a signal, a rising clock edge, or a falling clock edge. The data can be passed to an output buffer or to other system devices such as a processor or disk drive.

The second mux 213 is connected to the storage unit 101, mux control 211, and the at least one second latch 214. The second mux 213 directs data to the at least one second latch 214 from the storage unit 101 in response to a signal from mux control 11. The at least one second latch 214 passes data on a second event. The second event an be a signal, a rising clock edge, or a falling clock edge.

Figure 2B:
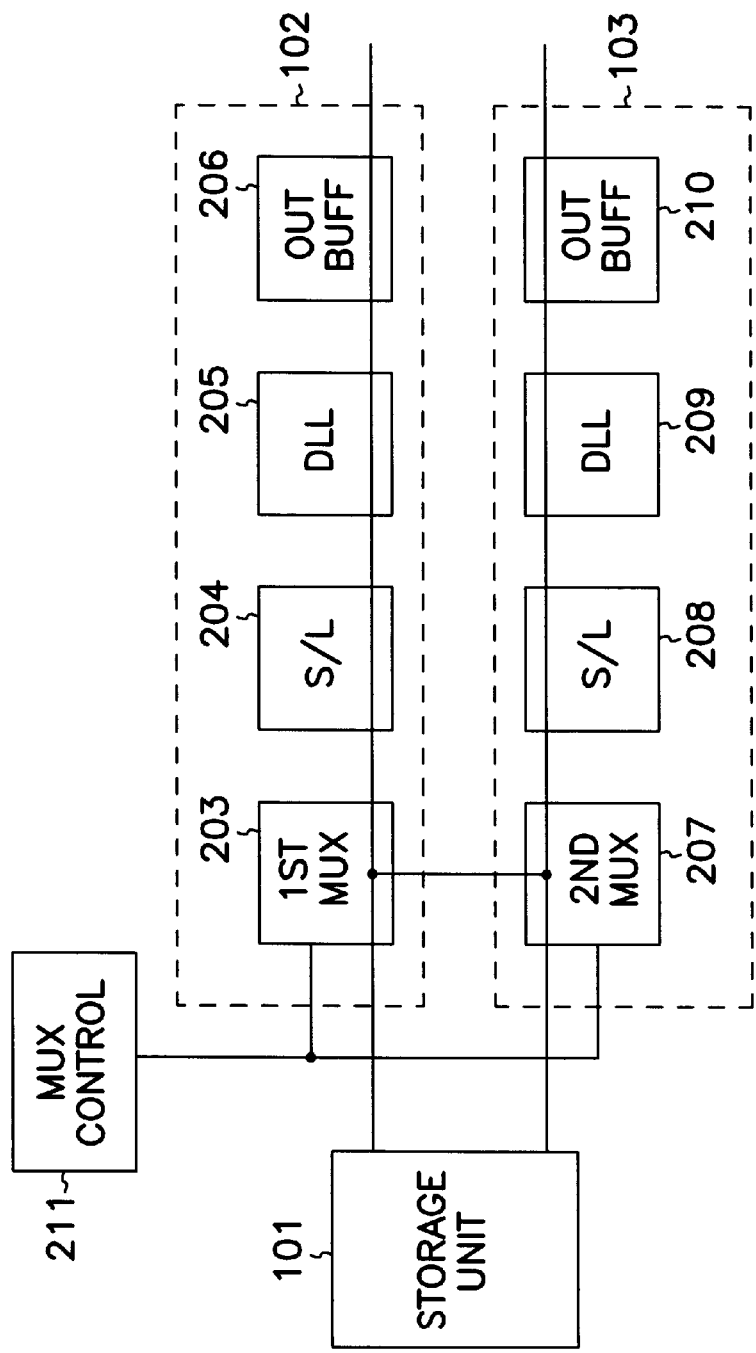

FIG. 2B is a memory device according to an embodiment of the invention. The memory device includes a storage unit 101, a first pipeline 102, a second pipeline 103, a mux control 211, a first mux 203, at least one first strobe latch 204, a first DLL latch 205, a second mux 207, at least one second strobe latch 208, a second DLL latch 209, a first output buffer 206, and a second output buffer 210.

The first pipeline includes the first mux 203, the at least one first strobe latch 204, the first DLL latch 205, and the first output buffer 206. The first mux 203 is connected to the storage unit 101. In other embodiments, the first mux 203 can be connected to a first array of the storage unit 101. The first mux 203 directs incoming data from the storage unit 101 to the at least one first strobe latch 204 in response to a signal from mux control 211. The first mux 203 can be controlled by the mux control 211, wherein the mux control 211 controls how and when the first mux 203 directs incoming data from the storage unit 101 to be placed on the first pipeline 102.

The at least one first strobe latch 204 is connected to the first mux 203 and first DLL latch 205. The at least one first strobe latch 204 passes data from the storage unit 101 through the first mux 203 to the first DLL latch 205. If the at least one first strobe latch 204 includes more than one latch, the latches are connected to each other in series. The time to pass data from the storage unit 101 to the strobe latches can be longer than a cycle time. Cycle time is the time between rising edges of the external clock. This time to pass data is also referred to as the data access time (DAT). Each of the at least one strobe latch 204 pipes or passes data to the next latch on a rising edge of the external clock or a determined offset from the rising edge of the external clock. The offset is adjusted so that data is not passed to the next latch until the next latch has passed its data to a subsequent latch or device. In some embodiments, a signal may be connected to each latch to cause each latch to pass data.

The first DLL latch 205 is connected to the at least one first strobe latch 204 and the output buffer 206. The first DLL latch 205 passes data from the at least one first strobe latch 204 to the output buffer 206. The data is passed such that it can be output or read from the first output buffer 206 at an appropriate time. For example, the first DLL latch can pass data in advance of the rising edge of the external clock so that data can be output or read from the first output buffer 206 on the rising edge of the external clock.

The second pipeline 103 includes the second mux 207, the at least one second strobe latch 208, the second DLL latch 209, and the second output buffer 210. The second mux 207 is connected to the storage unit 101. In other embodiments, the second mux 207 can be connected to a second array of the storage unit 101. The second mux 207 directs incoming data from the storage unit 101 to the at least one second strobe latch 208 in response to a signal from mux control 211. The second mux 207 can be controlled by the mux control 211, wherein the mux control 211 controls how and when the second mux directs incoming data from the storage unit 101 to be placed on the second pipeline 103. The mux control 211 can also determine which pipeline data is passed to.

The at least one second strobe latch 208 is connected to the second mux 207 and second DLL latch 209. The at least one second strobe latch 208 passes data from the storage unit 101 through the second mux 207 to the second DLL latch 209. If the at least one second strobe latch 208 includes more than one latch, the latches are connected to each other in series. The time to pass data from the storage unit 101 to the strobe latches can be longer than a cycle time. Cycle time is the time between rising edges of the external clock. This time to pass data is also referred to as the data access time (DAT). Each of the at least one second strobe latch 208 pipes or passes data to the next latch on a rising edge of the external clock or at a determined offset from the rising edge of the external clock. The offset is adjusted so that data is not passed to the next latch until the next latch has passed its data to a subsequent latch or device. In some embodiments, a signal may be connected to each latch to cause each latch to pass data.

The second DLL latch 209 is connected to the at least one second strobe latch 208 and the second output buffer 210. The second DLL latch 205 passes data from the at least one second strobe latch 208 to the second output buffer 210. The data is passed such that it can be output or read from the second output buffer 210 at an appropriate time. For example, the second DLL latch can pass data in advance of the falling edge of the external clock so that data can be output or read from the second output buffer 210 on the falling edge of the external clock. In other embodiments, the first output buffer 206 and the second output buffer 210 are combined into one output buffer.

The mux control 211 is connected to the first 203 and second 207 muxes. The mux control 211 controls how data from the storage unit 101 is selected and placed on the pipelines. The mux control 211 can determine which pipeline data will be placed on first.

Figure 3:
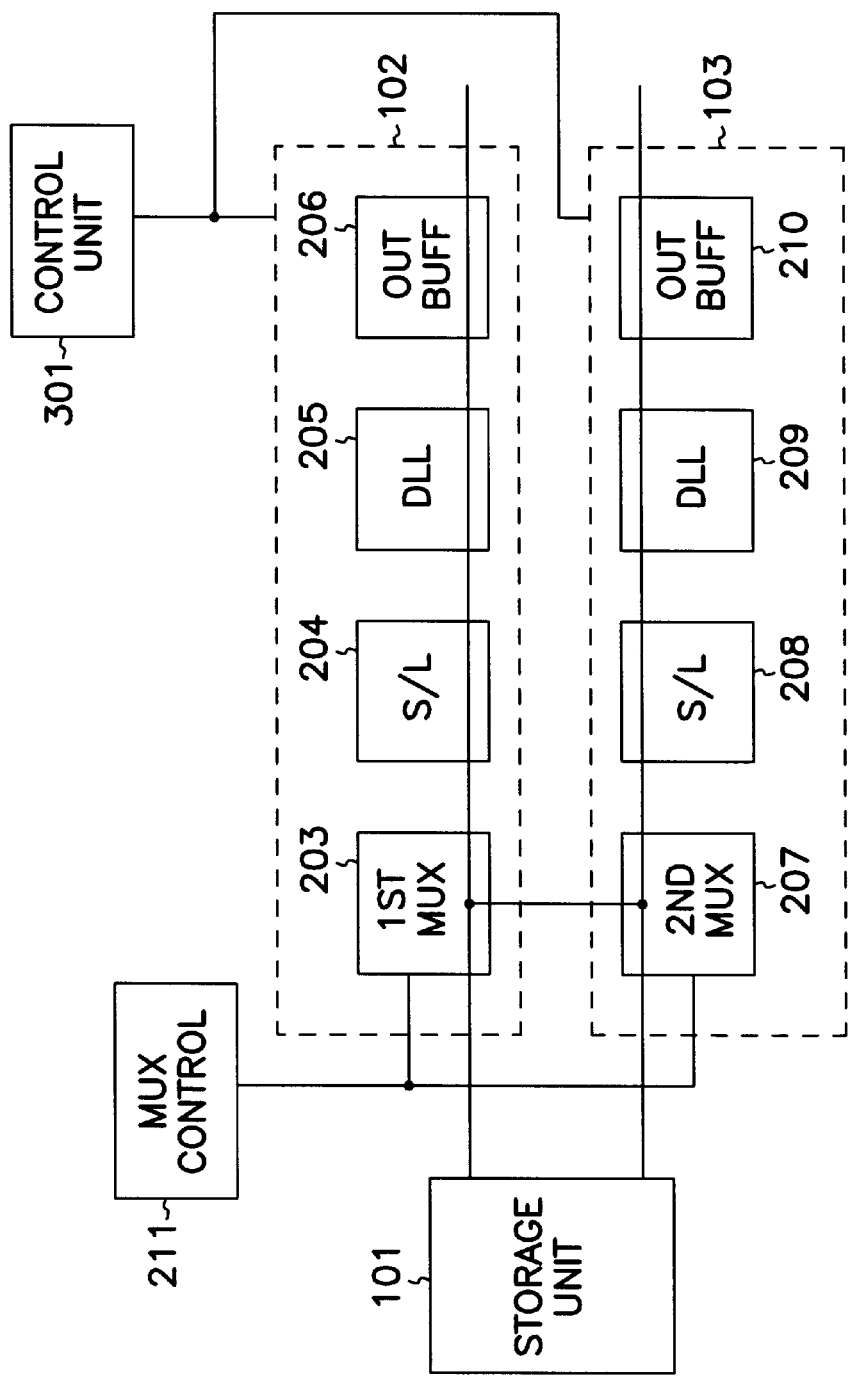
FIG. 3 is a block diagram of one embodiment of a memory device with a control circuit.

Referring to FIG. 3, a system according to an embodiment of the invention is disclosed. The system includes a storage unit 101, a first pipeline 102, a second pipeline 103, a mux control 211, a first mux 203, an at least one first strobe latch 204, a first DLL latch 205, a second mux 207, an at least one second strobe latch 208, a second DLL latch 209, and a control unit 301.

The control unit 301 may generate a delay lock loop (DLL) clock or an internal clock. The DLL clock operates at the same frequency as the external clock but operates in advance of the external clock. The control unit 301 may determine the amount that the DLL clock operates in advance of the external clock. The DLL clock allows the last latches or stages of the pipeline to fire in advance of the external clock to compensate for delays in passing data on the pipeline so that data is passed from the pipelines such that it can be passed to an output buffer or read on the edges of the external clock. The DLL clock can be connected to the DLL latches 205 and 209. The control unit 301 is connected to the pipelines and the elements of the pipelines. The control unit 301 controls the various stages or latches so that data is output synchronous to the external clock. The control unit 301 may connect the external clock to the strobe latches 204 and 208.

In some embodiments, the control unit 301 sends one or more signals to individual latches of the pipelines to control the passing of data along the pipelines.

The control unit 301 can be programmable to adjust timing of outputting the data by factoring latency and clock cycle time. Latency may be provided externally to the device. Clock cycle time propagation delays can be detected by the control unit 301.

Figure 4B:
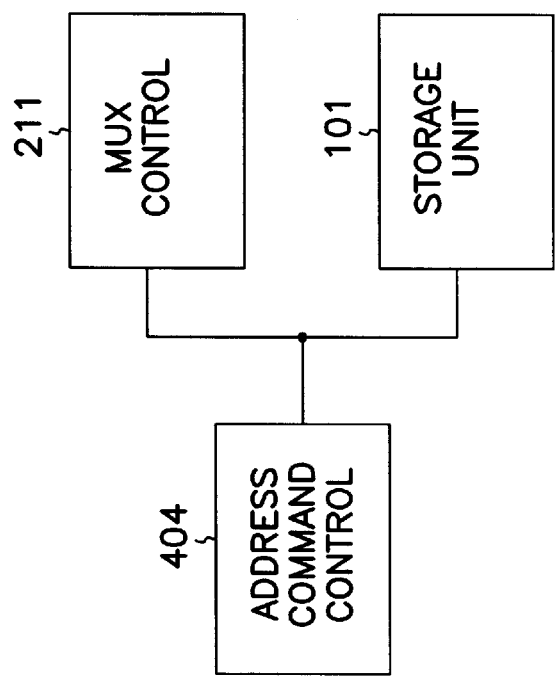
FIGS. 4A and 4B are block diagrams of one embodiment of a control circuit.
Figure 4A:
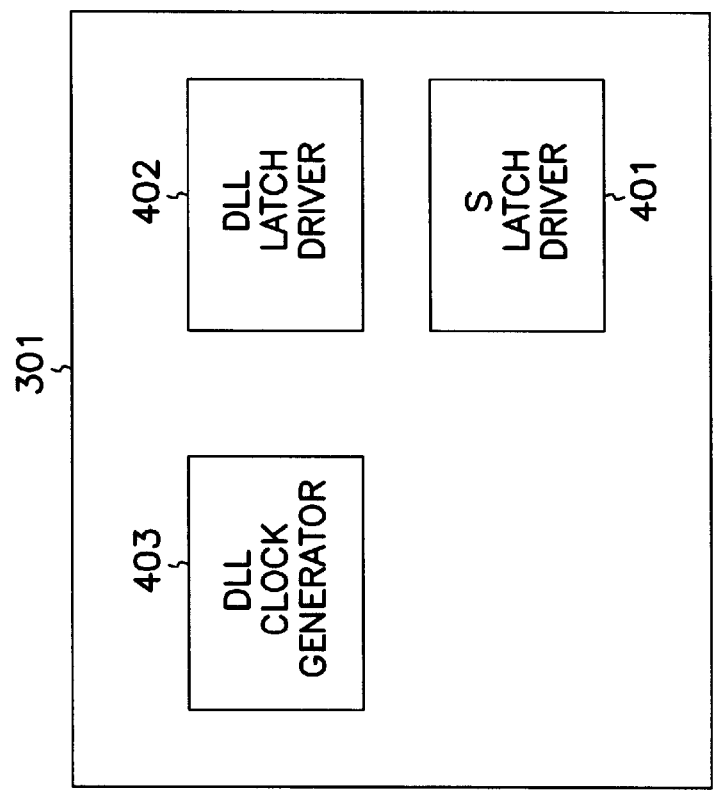

FIG. 4A discloses one possible implementation of the control unit 301. The control unit 301 can include a strobe latch driver 401, a DLL latch driver 402, and a DLL clock generator 403. The strobe latch driver 401 is connected to the strobe latches. The strobe latch driver 401 can produce signals to tell the strobe latches when to pass data. The strobe latch driver 401 can be used to tell or signal the individual strobe latches when to pass data to the next latch. The strobe latch driver 401 factors in latency and clock cycle time in controlling or signaling the strobe latches. The strobe latch driver 401 generates signals for the strobe latches at various offsets from the external clock based on the latency, clock cycle time, and propagation time of the pipelines.

The DLL clock generator 403 generates a DLL clock. The DLL clock operates in advance of an external clock.

The DLL latch driver 402 is connected to the DLL latches. The DLL latch driver 401 is used to tell or signal the DLL latches when to pass data to the next latch or buffer. The DLL latch driver 401 factors in latency in controlling the DLL latches. The DLL latch driver 402 utilizes the DLL clock to adjust timing of passing of data so that data is output properly and is synchronous with the external clock. The DLL latch driver 402 can control the DLL latches so that data is output alternately from pipelines on rising and falling edges of the DLL clock so data can be available synchronous with the external clock. The DLL latch driver can produce signals for control of the DLL latches.

FIG. 4B discloses a system according to one embodiment of the invention. The system includes an address command control 404, a mux control 211, and a storage unit 101 for use in accordance with the invention. The address command control 404 is connected to the mux control 211 and the storage unit 101. The address command control 404 selects the data in the storage unit 101 which will be output from the system. The address command control 404 can select the data in response to a read command. The address command control 404 can communicate with the mux control 211 to direct data from the storage unit 101 such the first unit of data is output on a desired event or clock edge such as a first rising edge or falling edge of a clock.

Figure 5:
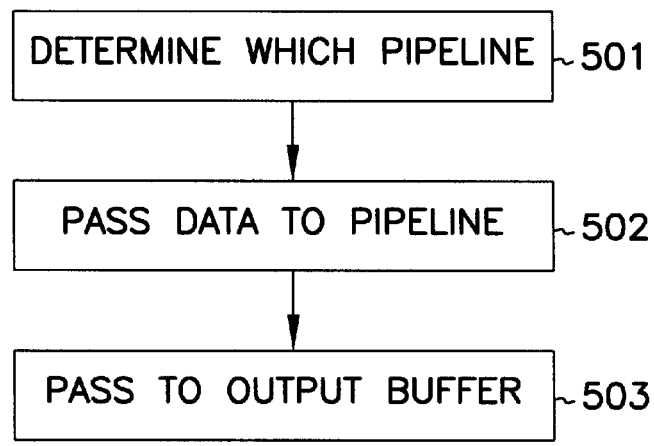
FIG. 5 is a flowchart of one embodiment of a method for reading data.

Referring to FIG. 5, a method for reading data on a memory device having a storage unit, a first pipeline, and a second pipeline according to an embodiment of the invention is disclosed.

A determination is made as to which pipeline data is placed on 501. In some cases, data will be placed on the first pipeline which can output data on rising edges of an external clock. In other cases, data will be placed on the second pipeline which can output data on falling edges of the external clock. This determination can be made by an address of data and latency. Data is passed from the storage unit to the pipelines 502. The data can be passed to the first and second pipelines simultaneously or alternatingly For example, if the first piece of data is placed on the first pipeline, the second piece of data is placed on the second pipeline and the third piece of data is again placed on the first pipeline. Data is passed by the pipelines to an output buffer 503 such that it can be read on rising and falling edges of the external clock. In alternative embodiments, the data is passed by the pipelines and cycle time and latency are used to adjust the timing of the outputting of the data. In other embodiments, data is passed by the pipelines to an output buffer 503 such that it can be read on first and second events.

Figure 6:
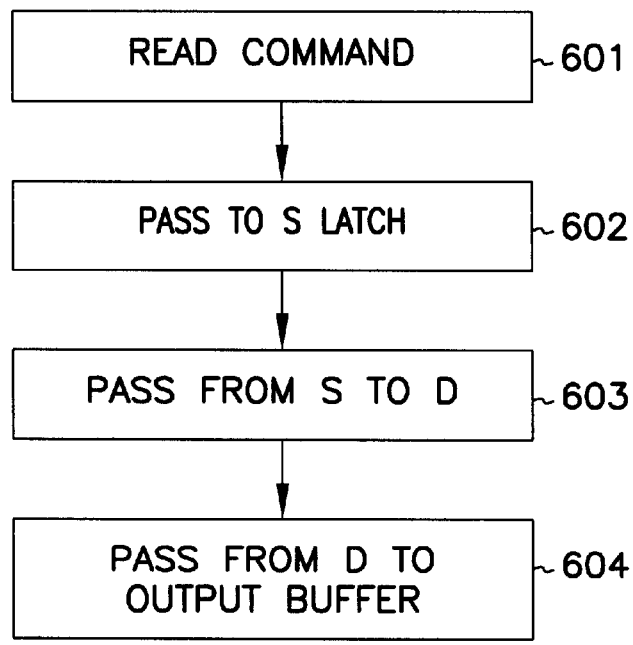
FIG. 6 is a flowchart of one embodiment of a method for reading data.

Referring to FIG. 6, a method for reading data according to an embodiment of the invention is disclosed.

A read command is issued 601. For example, a processor may make a request to read the data of a certain memory location. The data can be located in a storage unit. The data, for example, may be a bit, a byte, or any amount of data. The storage unit could be an array or memory cell. Each piece of the data is passed through a mux to a strobe latch of a pipeline 602. The pipeline is one of a plurality of pipelines. Each piece of the data is passed from the strobe latch to a delay latch of the pipeline 603. The data can be passed on an edge of an external clock or some other event or signal. Each piece of the data is passed from the delay latch to a system device 604. The data can be passed on an edge of an external clock or a clock in advance of the external clock. The system device can be a processor or a memory device. Each piece of data is an amount of data that can be transferred. Examples of such pieces of data are a bit, byte, or a word.

In another embodiment, a DLL clock is used to pass data from the pipelines to compensate for delays in data being passed through the pipeline.

Figure 7A:
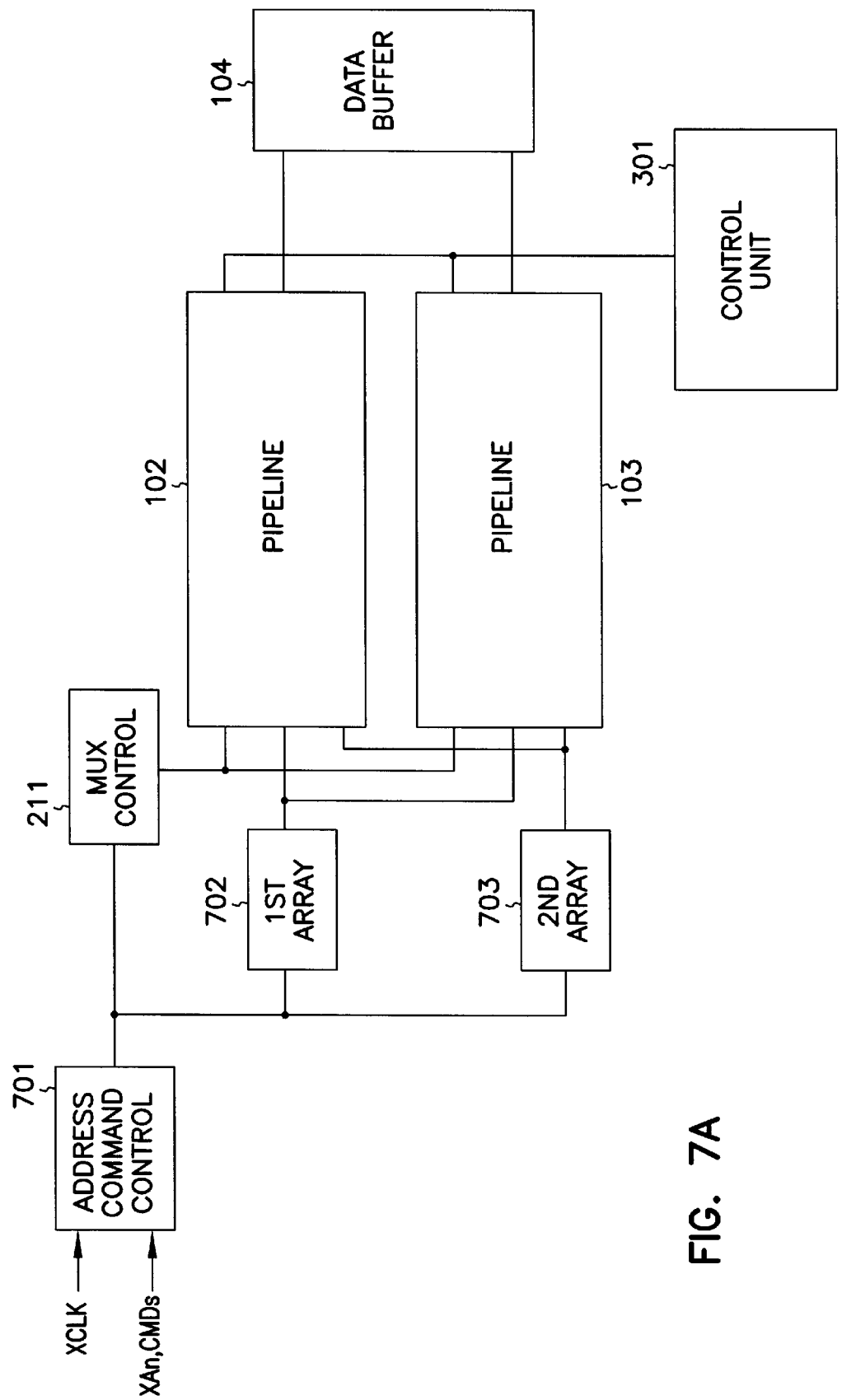
FIG. 7A is a block diagram of one embodiment a memory device.
Figure 7B:
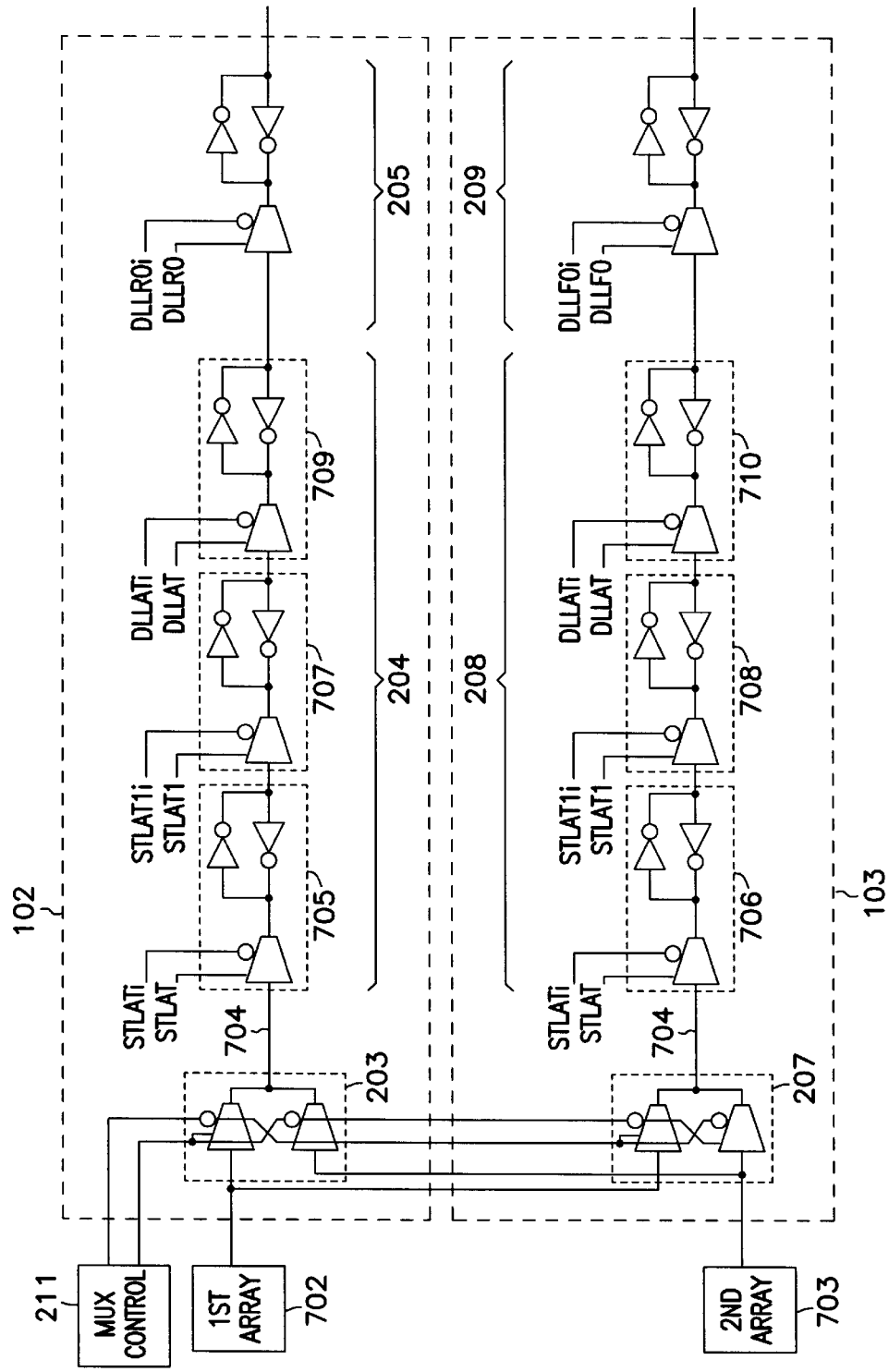
FIG. 7B is a block diagram of a possible implementation of pipelines.

FIGS. 7A and 7B show a memory device. The memory device includes an address command control 701, a first array 702, a second array 703, a mux control 211, a first pipeline 102, a second pipeline 103, a data buffer 104, and a control circuit 301. The address command control 701 is connected to the first array 702, the second array 703, and the mux control 211. The address command control 701 operates on a read command and selects data to be read from the first array 702 and the second array 703. The address command control 701 also informs the mux control 211 which pipeline data to be read is placed on. The mux control 211 is connected to the first mux 203, the second mux 207, and the address command control 701. The mux control 211 directs data from the first array 702 and the second array 703 to the first mux 203 of the first pipeline 102 or the second mux 207 of the second pipeline 103. The mux control can send a mux control signal (CTL) and its complement (CTLi) to the first mux 203 and the second mux 207 to direct data to the first 102 and second 103 pipelines respectively. For example, if CTL is high and CTLi is low, first data or a first piece of data is directed to the first pipeline and second data or a second piece of data is directed to the second pipeline and if CTL is low and CTLi is high, first data or a first piece of data is directed to the second pipeline and second data or a second piece of data is directed to the first pipeline.

The first pipeline 102 includes a first mux 203, a first latch 705, a second latch 707, a third latch 709, and a first DLL latch 205 connected in series. STLAT and its complement STLATi, are strobe latch control signals used to time the passing of data through the first latch 705. When STLAT is high and STLATi is low, data passes through the first latch 705. STLAT1 and its complement STLAT1, are control signals used to time the passing of data through the second latch 707. When STLAT1 is high and STLATl1 is low, data passes through the second latch 707. DLLAT and DLLAT1, are DLL latch control signals used to time the passing of data through the third latch 709 to the first DLL latch 205. When DLLAT is high and DLLATi is low, data passes through the third latch 709. DLLR0 and its complement DLLR0i, are DLL latch control signals used to time the passing of data through the first DLL latch 205. When DLLR0 is high and DLLR0i is low, data passes through the first DLL latch 205 and makes the data available for output on a rising edge of a clock.

The second pipeline 103 includes a second mux 207, a first latch 706, a second latch 708, a third latch 710, and a second DLL latch 209 connected in series. When STLAT is high and STLATi is low, data passes through the first latch 706. When STLAT1 is high and STLAT1i is low, data passes through the second latch 708. When DLLAT is high and DLLATi is low, data passes through the third latch 710 to the second DLL latch 209. DLLF0 and its complement DLLF0i, are control signals used to time the passing of data through the second DLL latch 209 and makes the data available for output on a falling edge of a clock.

The STLAT and STLAT1 signals occur at fixed offsets to the rising edge of the clock. The latency, cycle time, and propagation delay of the memory circuit are taken into consideration. The signals occur such that data is passed to a next latch only after the next latch has passed its data to a subsequent latch or other device.

The DLLR0 signal and the DLLF0 signals are created from the rising and falling edges of a DLL clock, respectively. The DLL clock operates at the same frequency as the clock but operates in advance of the clock so that data is available on rising and falling edges of the clock. The DLLAT signal occurs on falling edges of the DLLR0 signal or the DLLF0 signals depending on the latency.

Figure 8:
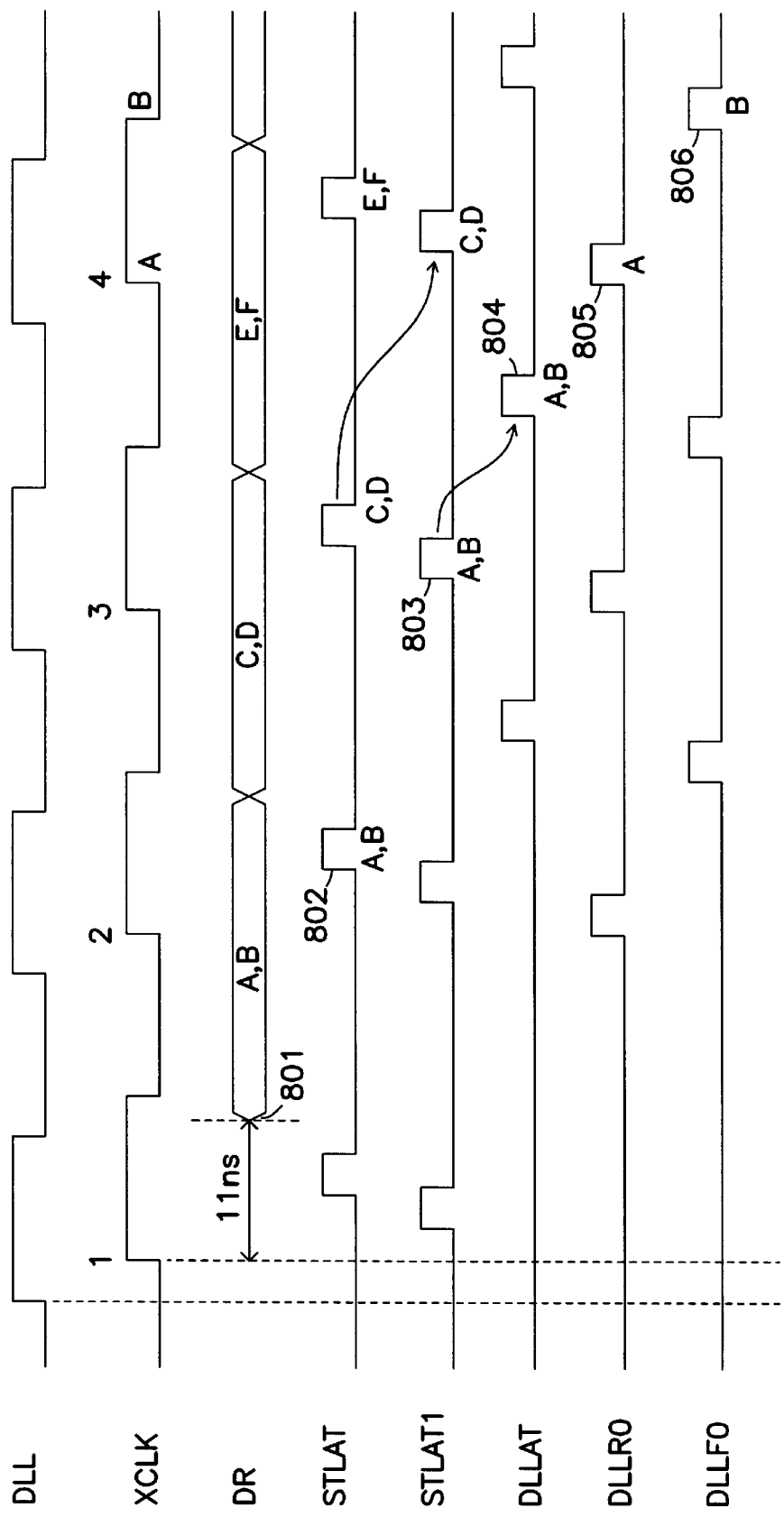
FIG. 8 is a timing diagram of a memory device for a latency of 3 and a clock cycle of 30 ns.

FIG. 8 is a timing diagram for the implementation shown in FIGS. 7A and 7B of a dual data rate memory device in a system with a latency of 3 and a clock cycle of 30 ns. This same timing can also be used for other clock cycle times such as 5 ns. The DLL line is the DLL clock. The XCLK is the external clock. The DR shows the time selected data takes to propagate from the first and second arrays (702 and 703) to the first latches (705 and 706) and is identified by reference point 704 on FIG. 7B. After a read command on the first rising edge of an external clock (XCLK) cycle, it takes about 11 ns for the data (A,B) to be fetched from the arrays and placed on the pipelines at point 704 and is shown in FIG. 8 at reference point 801. This time period is the data access time (DAT) and is 11 ns in this embodiment. After the second rising edge of the XCLK, the data is passed to and stored in the first latches (705 and 706) on the STLAT signal as shown at reference point 802. After the third rising edge, the data is passed from the first latches (705 and 706) to the second latches (707 and 708) on the STLAT1 signal before the next data (C,D) is passed to the first latches (705 and 706) on the STLAT signal as shown at reference point 803. Then, data (A,B) is passed from the second latches (707 and 708) to the third latches (709 and 710) on the DLLAT signal as shown at reference point 804. The DLLAT signal fires on the falling edge of DLLF0 because the latency is a whole latency, 3. In other embodiments, the DLLAT signal fires on the falling edge of DLLR0, generally, for half latencies such as ½, 1½, and 2½. On the DLLR0 signal which occurs on the rising edge of the DLL clock, the first DLL latch 205 is passed data "A" and makes it available to be read on the rising edge of XCLK as shown at reference point 805. On the DLLF0 signal which occurs on the falling edge of the DLL clock, the second DLL latch 209 is passed data "B" and makes it available to be read on the falling edge of XCLK as shown at reference point 806.

Figure 9:
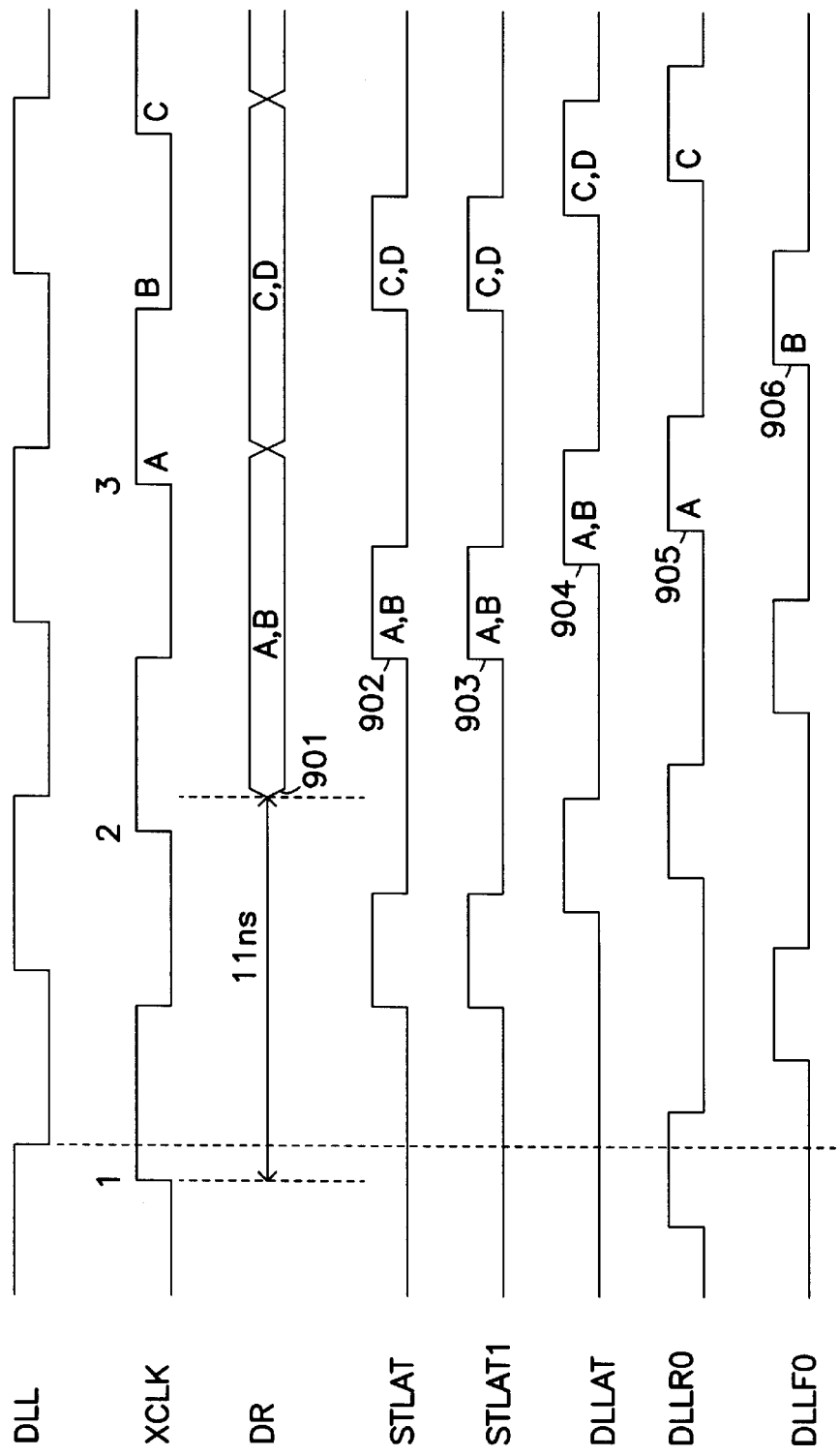
FIG. 9 is a timing diagram of a memory device for a latency of 2 and a clock cycle of 10 ns.

FIG. 9 is a timing diagram for the implementation shown in FIGS. 7A and 7B of a dual data rate memory device in a system with a latency of 2 and a clock cycle time of 10 ns. The DLL line is the DLL clock. The XCLK is the external clock. The DR shows the time selected data takes to propagate from the first and second arrays (702 and 703) to the first latches (705 and 706) and is identified by reference point 704 on FIG. 7B. After a read command on the first rising edge of an XCLK cycle, it takes about 11 ns for the data (A,B) to be fetched from the arrays and placed on the pipelines as shown at reference point 901. This time period is the data access time (DAT) and is 11 ns in this embodiment. After the second rising edge of the XCLK, the data is passed to and stored in the first latches (705 and 706) on the STLAT signal as shown at reference point 902. Here, the cycle time is short so the STLAT1 signal occurs close to the same time as STLAT, but not before it and causes data to be passed from the first latches (705 and 706) to the second latches (707 and 708) as shown at reference point 903. A short time later on the falling edge of DLLF0, the DLLAT signal fires and causes data to be passed from the second latches (707 and 708) to the third latches (709 and 710) as shown at reference point 904. On the DLLR0 signal as shown at reference point 905, "A" is passed to the first DLL latch 205 and is available to be read on the next rising edge of XCLK. On the DLLF0 signal, "B" is passe to the second DLL latch 209 and is available to be read or output on the falling edge of XCLK as shown at reference point 906.

The invention includes double data rate memory devices and methods. These allow data to be transferred at dual rates or greater.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A double data rate memory device comprising:
   a storage unit;
   a first pipeline coupled to the storage unit, wherein the first pipeline passes data from the storage unit and through the first pipeline on a rising edge of an external clock;
   a second pipeline, coupled to the storage unit, wherein the second pipeline passes data from the storage unit and through the second pipeline on a falling edge of the external clock; and
   wherein the first pipeline further comprises a first data mux connected to the storage unit and the second pipeline further comprises a second data mux connected to the storage unit, the first data mux directs data from the storage unit to the first pipeline and the second data mux directs data from the storage unit to the second pipeline.

2. The memory device of claim 1, wherein the storage unit comprises a first array of memory cells.

3. The memory device of claim 2, wherein the storage unit further comprises a second array, the first array is coupled to the first pipeline and the second array is coupled to the second pipeline.

4. A double data rate memory device comprising:
   storage unit;
   a first pipeline coupled to the storage unit, wherein the first pipeline passes data from the storage unit and through the first pipeline on a rising edge of an external clock;
   a second pipeline, coupled to the storage unit, wherein the second pipeline passes data from the storage unit and through the second pipeline on a falling edge of the external clock;
   a control unit connected to the first and second pipelines; and wherein the control unit signals the first and second pipelines to pass data based on latency and clock cycle time.

5. A double data rate memory device comprising:
   a storage unit;
   a first pipeline coupled to the storage unit, wherein the first pipeline passes data from the storage unit and through the first pipeline on a rising edge of an external clock;
   a second pipeline, coupled to the storage unit, wherein the second pipeline passes data from the storage unit and through the second pipeline on a falling edge of the external clock;
   a control unit connected to the first and second pipelines; and
   wherein the control unit generates an internal clock.

6. The memory device of claim 5, wherein the first pipeline includes a first plurality of stages, the second pipeline includes a second plurality of stages, and wherein the control unit controls the passing of data among the stages of the first and second pipelines.

7. An integrated circuit comprising:
   a first array of memory cells having first data;
   a second array of memory cells having second data;
   a first pipeline, having a first data mux connected to the first array and a first latch, and operable for outputting data on a rising edge of a clock;
   a second pipeline, in parallel with the first pipeline, having a second data mux connected to the second array and a second latch, and operable for outputting data on a falling edge of the clock; and a data mux controller connected to the first and second data muxes to direct the first data to the first pipeline and to direct the second data to the second pipeline.

8. The integrated circuit of claim 7, further comprising a control unit connected to the first pipeline and the second pipeline, wherein the control unit synchronizes the output of data with the clock by utilizing propagation time of the pipelines.

9. The integrated circuit of claim 7, wherein the first and second arrays are physically located in a memory array.

10. The integrated circuit of claim 7, wherein the first array is physically located separately from the second array.

11. The integrated circuit of claim 7, wherein the pipelines further comprise at least one latch connected in series.

12. An integrated circuit comprising:

a first array of memory cells having a first portion of data;

a second array of memory cells having a second portion of data;

a first pipeline, having a first data mux connected to the first array and the second array, for outputting data on a rising edge of a clock;

a second pipeline, in parallel with the first pipeline, having a second data mux connected to the second array and the first array, for outputting data on a falling edge of the clock; and a data mux controller connected to the first and second data muxes to direct the data to the first pipeline and the second pipeline.

13. The integrated circuit of claim 12, wherein the mux controller determines which pipeline data from the first and second arrays is placed on.

14. The integrated circuit of claim 12, further comprising an output buffer connected to the first and second pipeline.

15. The integrated circuit of claim 12, wherein the pipelines further comprise at least one latch connected in series.

16. The integrated circuit of claim 15, wherein the at least one latch is operated by the control unit.

17. An integrated circuit comprising:

a first array of memory cells having a first portion of data;

a second array of memory cells having a second portion of data;

a first pipeline, having a first data mux connected to the first array and the second array, for outputting data on a rising edge of a clock, a second pipeline, in parallel with the first pipeline, having a second data mux connected to the second array and the first array, for outputting data on a falling edge of the clock; and a data mux controller connected to the first and second data muxes to direct the data to the first pipeline and the second pipeline;

wherein the first pipeline further comprises a first delay lock loop latch and the second pipeline further comprises a second delay lock loop latch.

18. The integrated circuit of claim 17, wherein a rising edge latch operates on a rising edge of an internal clock and a falling edge latch operates on a falling edge of the internal clock, the internal clock operates in advance of the clock.

19. An integrated circuit comprising:

a storage unit;

a first pipeline, having a first data mux connected to the storage unit, for outputting data on a rising edge of a clock;

a second pipeline, having a second data mux connected to the storage unit, for outputting data on a falling edge of the clock; and a data mux controller connected to the first and second data muxes to direct data from the storage unit to the first pipeline and the second pipeline.

20. An integrated circuit comprising:

a storage unit a first pipeline having a first data mux connected to the storage unit, at least one first latch connected in series to the first data mux, and a first delay lock loop latch connected to the at least one first latch;

a second pipeline having a second data mux connected to the storage unit, at least one second latch connected in series to the second data mux and a second delay lock loop latch connected to the at least one second latch;

a data mux controller connected to the first and second data muxes to direct first data to the first pipeline and second data to the second pipeline simultaneously; and a control unit, having an internal clock, connected to the first and second pipelines, to synchronize output of data with rising and falling edges of an external clock.

21. The integrated circuit of claim 20 further comprising an output buffer connected to the first delay lock loop latch and the second delay lock loop latch, wherein the control unit signals the first delay lock loop latch to pass first data to the output buffer and signals the second delay lock loop latch to pass second data to the output buffer.

22. An integrated circuit comprising:

a first array of memory cells;

a second array of memory cells;

an output buffer an address command control, connected to the first and second arrays for selecting data;

a first pipeline, having a first mux connected to the first array, at least one first latch connected in series to the first data mux and a first delay lock loop latch connected to the at least one first latch and the output buffer;

a second pipeline, having a second mux connected to the second array, at least one second latch connected in series to the second data mux and a second delay lock loop latch connected to the at least one second latch and the output buffer;

a mux control connected to the first mux and the second mux to direct data from the arrays to the data muxes; and a control circuit, connected to the first and second pipelines, comprising:

an internal clock generate to generate an internal clock, which operates in advance of an external clock;

a latch driver to signal the at least one first latch and the at least one second latch to pass data; and a delay lock loop latch driver utilizing the internal clock to signal the first delay lock loop latch and the second delay lock loop latch to pass data.

23. A computer system comprising:

a processor; and at least one memory device comprising:

a storage unit;

a first pipeline connected the storage unit, wherein first data from the storage unit is passed from the first pipeline on a rising edge of a clock;

a second pipeline connected to the storage unit, wherein second data from the storage unit is passed from the second pipeline on a falling edge of the clock;

wherein the at least one memory device further comprises a control unit connected to the pipelines to control the passing of the first data through the first pipeline and the second data through the second pipeline; and wherein the control unit factors in latency and cycle time in controlling the passing of the first data through the first pipeline and the second data through the second pipeline.

24. A computer system comprising:
a processor; and
at least one memory device comprising:
  a storage unit;
  a first pipeline connected the storage unit, wherein first data from the storage unit is passed from the first pipeline on a rising edge of a clock;
  a second pipeline connected to the storage unit, wherein second data from the storage unit is passed from the second pipeline on a falling edge of the clock; and
  wherein each memory device further comprises a mux control unit connected to the storage unit, the first pipeline, and the second pipeline to direct the first data to the first pipeline and to direct the second data to the second pipeline.

25. The computer system of claim 24, wherein the at least one memory device further comprises a control unit connected to the pipelines to control the passing of the first data through the first pipeline and the second data through the second pipeline.

26. A computer system comprising:
a processor; and
at least one memory device comprising:
  a storage unit;
  a first pipeline connected the storage unit, wherein first data from the storage unit is passed from the first pipeline on a rising edge of a clock;
  a second pipeline connected to the storage unit, wherein second data from the storage unit is passed from the second pipeline on a falling edge of the clock; and
  wherein each memory device further comprises an address command control unit connected to the storage unit and the address command control unit selects the first and second data to be passed in response to a read command.

27. A method for reading data from a memory device having a storage unit, a first pipeline and a second pipeline comprising:
selecting data in a storage unit, wherein the data includes first data and second data;
directing the first data to the first pipeline;
directing the second data to the second pipeline;
passing the first data from the first pipeline to an output buffer for output on a rising edge of a clock;
passing the second data from the second pipeline to the output buffer for output on a falling edge of the clock; and
wherein the clock is an internally generated clock such that the first and second data may be read from the output buffer on a rising and falling edge of an external clock.

28. Presented) The method of claim 27, wherein the storage unit includes a first array of memory cells and a second array of memory cells and the first data is located in the first array and the second data is located in the second array.

29. A method comprising:
passing a first piece of data from a storage unit through a first mux to a first latch and passing a second piece of data from the storage unit through a second mux to a second latch;
on a first signal, passing the first piece through the first latch to a third latch and passing the second piece through the second latch to a fourth latch;
on a second signal, passing the first piece of data through the third latch to a fifth latch and passing the second piece through the fourth latch to a sixth latch;
on a third signal, passing the second piece of data through the sixth latch; and
on a fourth signal, passing the first piece of data through the fifth latch.

30. The method of claim 29 further comprising:
generating an internal clock which operates in advance of an external clock;
generating the third signal on falling edges of the internal clock; and
generating the fourth signal on rising edges of the internal clock.

31. The method of claim 30 further comprising:
generating a first signal on predetermined offsets from rising edges of the external clock.

32. A method for controlling a memory device having two pipelines, the pipelines having at least two latches connected in series, comprising:
determining latency and cycle time;
generating an internal clock which is advance of an external clock by utilizing the latency and the cycle time;
signaling the latches of the pipelines to pass data through the pipeline wherein the data is passed on both the rising edge and the falling edge of the internal clock; and
outputting the data from the pipelines synchronous to the external clock.

33. A method for controlling a memory device have a plurality of pipelines each having at least one strobe latch and one delay lock loop latch comprising:
determining latency and cycle time for the memory device;
generating an internal clock which is advance of an external clock by utilizing the latency and the cycle time;
signaling the at least one strobe latch on an offset from the external clock;
signaling the delay lock loop latch on an offset from the internal clock; and
outputting data from the plurality of pipelines wherein the data is output on both the rising edge and the falling edge of the external clock.

34. A double data rate memory device comprising:
a storage unit;
a first pipeline coupled to the storage unit, wherein the first pipeline passes data from the storage unit and through the first pipeline on a rising edge of an external clock;
a second pipeline, coupled to the storage unit, wherein the second pipeline passes data from the storage unit and through the second pipeline on a falling edge of the external clock;
wherein the first pipeline further comprises a first data mux connected to the storage unit and the second pipeline further comprises a second data mux connected to the storage unit, the first data mux directs data from the storage unit to the first pipeline and the second data mux directs data from the storage unit to the second pipeline; and a control unit connected to the first and second pipelines, wherein the control unit signals the first and second pipelines to pass data based on latency and clock cycle time.

35. The double data rate memory device of claim 34, wherein the control unit generates an internal clock.

36. The double data rate memory device of claim 34, further comprises an address command control unit connected to the storage unit and the address command control unit selects data to be passed in response to a read command.

* * * * *

UNITED STATES PATENT AND TRADEMARK OFFICE
CERTIFICATE OF CORRECTION

PATENT NO. : 6,694,416 B1
DATED : February 17, 2004
INVENTOR(S) : Thomann et al.

It is certified that error appears in the above-identified patent and that said Letters Patent is hereby corrected as shown below:

Title page,
Item [56], References Cited, U.S. PATENT DOCUMENTS, delete "710/22" and insert -- 364/900 --, therefor; after "5,402,389 A" insert -- * --; delete "714/763" and insert -- 371/40.11 --, therefor; delete "365/47.53" and insert -- 365/200 --, therefor; delete "714/758" and insert -- 371/37.7 --, therefor; delete "710/60" and insert -- 395/880 --, therefor; delete "710/53" and insert -- 395/873 --, therefor.
FOREIGN PATENT DOCUMENTS, delete "99/50862" and insert -- 99/50852 --, therefor.

Column 2,
Line 23, after "embodiment" insert -- of --.

Column 4,
Lines 24-25, after "used." delete "Any number of arrays or subarrays may be used.".
Line 39, delete "11" and insert -- 211 --, therefor.
Line 40, delete "an" and insert -- can --, therefor.

Column 7,
Line 21, delete "alternatingly" and insert -- alternatively. --, therefor.

Column 8,
Line 18, delete "STLAT1" and insert -- STLAT1i --, therefor.
Line 20, delete "STLATI1" and insert -- STLAT1i --, therefor.
Line 21, delete "DLLAT1" and insert -- DLLATi --, therefor.

Column 9,
Line 51, delete "passe" and insert -- passed --, therefor.

Column 10,
Line 27, insert -- a -- before "storage".

UNITED STATES PATENT AND TRADEMARK OFFICE
CERTIFICATE OF CORRECTION

PATENT NO.     : 6,694,416 B1
DATED          : February 17, 2004
INVENTOR(S)    : Thomann et al.

It is certified that error appears in the above-identified patent and that said Letters Patent is hereby corrected as shown below:

Column 11,
Line 47, delete "," and insert -- ; --, therefor.

Column 13,
Line 63, delete "Presented)" before "The method".

Signed and Sealed this

Twenty-ninth Day of June, 2004

JON W. DUDAS
*Acting Director of the United States Patent and Trademark Office*